United States Patent [19]

Yokono et al.

[11] Patent Number: 5,133,403

[45] Date of Patent: Jul. 28, 1992

[54] COOLING ARRANGEMENT FOR SEMICONDUCTOR DEVICES AND METHOD OF MAKING THE SAME

[75] Inventors: Hitoshi Yokono, Toride; Takao Terabayashi, Tokohama; Nobuo Kayaba, Yokohama; Takahiro Daikoku, Ushiku; Shigekazu Kieda, Ishioka; Fumiyuki Kobayashi, Sagamihara; Shizuo Zushi, Hadano, all of Japan

[73] Assignee: Hitachi, Ltd., Tokyo, Japan

[21] Appl. No.: 423,386

[22] Filed: Oct. 19, 1989

[30] Foreign Application Priority Data

Oct. 19, 1988 [JP] Japan .................. 63-261471

[51] Int. Cl.$^5$ .................................. F28F 7/00
[52] U.S. Cl. ...................... 165/185; 165/80.3; 165/80.4; 361/382; 361/386; 361/388
[58] Field of Search ............ 165/80.4, 185, 80.3; 361/381, 382, 386, 388

[56] References Cited

U.S. PATENT DOCUMENTS

| | | | |
|---|---|---|---|
| 4,263,965 | 4/1981 | Mansuria et al. | 165/185 |
| 4,429,732 | 2/1984 | Moscrip | 165/185 |
| 4,498,530 | 2/1985 | Lipschutz | 165/80 |
| 4,574,879 | 3/1986 | Degree et al. | 165/185 |
| 4,591,537 | 5/1986 | Aldinger et al. | 361/386 |
| 4,649,990 | 3/1987 | Kurihara et al. | 165/185 |
| 4,765,400 | 8/1988 | Chu et al. | 165/185 |
| 4,770,242 | 9/1988 | Daikoku et al. | 165/185 |
| 4,774,632 | 9/1988 | Neugebauer | 361/388 |
| 4,800,956 | 1/1989 | Hamburgen | 165/185 |
| 4,810,563 | 3/1989 | Degree et al. | 165/185 |
| 4,852,646 | 8/1989 | Dittmer et al. | 165/185 |
| 4,878,152 | 10/1989 | Sauzade et al. | 165/185 |
| 4,884,331 | 12/1989 | Hinshaw | 165/185 |
| 4,943,468 | 7/1990 | Gordon et al. | 361/397 |

FOREIGN PATENT DOCUMENTS

| | | |
|---|---|---|
| 103337 | 6/1982 | Japan . |
| 144153 | 8/1984 | Japan . |
| 126853 | 7/1985 | Japan . |
| 32819 | 7/1986 | Japan . |

*Primary Examiner*—John Rivell
*Assistant Examiner*—L. R. Leo
*Attorney, Agent, or Firm*—Antonelli, Terry, Stout & Kraus

[57] ABSTRACT

A cooling device for cooling semiconductor elements by removing heat generated from the semiconductor elements such as, for example, semiconductor integrated chips in a large-sized electronic computer. The cooling device is fashioned of a composite AlN-BN sintered material having a Vickers hardness not higher than one-fifth of that of an AlN material, and an anisotropic property of thermal conductivity in a two dimensional direction is higher than that of AlN which is isotropic in thermal conductivity. The cooling device may be mass-produced while nevertheless having a high transfer performance matching the quantity of heat generated for each semiconductor element even if the composite sintered material is uniform in shape and size. The composite sintered material is formed by a mixture of a hexagonal BN powder having an average particle diameter of not less than 1 $\mu$m and an AlN powder having an average particle diameter of about 2 $\mu$m, with a sintering aid being added and the powdery mixture being subjected to a hot press sintering whereby the sintered material is low in thermal conductivity in a direction parallel to an axis of a shaft of the hot press.

42 Claims, 5 Drawing Sheets

COOLING ARRANGEMENT FOR SEMICONDUCTOR DEVICES AND METHOD OF MAKING THE SAME

BACKGROUND OF THE INVENTION

The present invention relates to cooling arrangement and, more particularly to a cooling arrangement for semiconductor devices for removing or dissipating heat generated, for example, semiconductor integrated circuit chips of a large-sized electronic computer and a method of making a sintered composite material for the cooling arrangements.

With the advent of large-sized electronic computers having a high processing speed, circuit chips having large scale integrated semiconductor elements have developed and, in order to make the electric wiring which interconnects the integrated circuit chips as short as possible, a number of methods of techniques have been proposed for mounting a large number of integrated circuit chips in a micropackage.

Cooling devices have been proposed in, for example, U.S. Pat. Nos. 3,993,123, 4,263,965, 4,770,242, 4,498,530 and Japanese Patent laid-open nos. 23463/83, 57-103337, 59-144153 and 61-32819.

Additionally, Japanese patent laid-open no. 60-126853 proposes a cooling device for a semiconductor device which provides for a superior cooling performance and which employs a resilient construction permitting assembly erro and heat deformation to be absorbed vertically and transversely.

In proposed cooling devices or systems employing a plurality of fins, the fins are disposed at a relatively small spacing from each other, with the device being fashioned of a material such as SiC or AlN which is considerably difficult to machine. Consequently, there are a number of disadvantages of the proposed constructions, namely, the poor processing of the material, required manufacturing techniques, etc., so that the cooling system is not comparable to other cooling systems from a point of view of production costs even though the proposed constructions may exhibit superior cooling capabilities.

Moreover, in a semiconductor electronic circuit for which a high-speed processing is required such as, for example, a large-sized electronic computer, the circuit output level differs in accordance with operating temperatures of the circuit, so that it is necessary that the temperatures of the LSI chips be maintained within a predetermined temperature range.

Furthermore, a large number of LSI chips mounted on a micropackage are not always used in such a manner that the quantity of heat generated is the same with respect to each of the chips by virtue of the logic design of the high speed electronic computer. On the other hand, if the fins of the proposed cooling devices are formed so as to have the same shape, number, and material, it follows that the fins fitted together have the same cooling performance. Consequently, in conventional cooling systems or devices, in order to maintain the temperature of the LSI chips having different generated quantities of heat within a predetermined temperature range, it is necessary to alter the shape and number of the fins for each LSI chip thereby raising a serious problem with regard to manufacturing costs when considering industrial mass production.

SUMMARY OF THE INVENTION

The aim underlying the present invention essentially resides in providing a cooling system or device for cooling semiconductor devices, which is capable of being produced at a low industrial cost and which exhibits a heat transfer performance matching the quantity of heat generated for each LSI chip despite having the same shape and number of fins.

In accordance with advantageous features of the present invention, a cooling device or system for a semiconductor device having at least one semiconductor element is provided, with the cooling device or system including a cooling means thermally contacting the semiconductor element and being adapted to absorb the heat generated from the semiconductor element, with the cooling means being formed of a composite sintered ceramic material comprising Aln and BN. The composite sintered ceramic material exhibits a high thermal conductivity in a direction of a two-dimensional plane and a low thermal conductivity in a direction perpendicular to the two dimensional plane.

In order to uniformalize the temperature distribution in a semiconductor element such as a semiconductor chip as much as possible even when a thermoconductive cooling element is mounted on the semiconductor chip, in accordance with the present invention, a portion of the thermoconductive cooling element which comes into contact with the semiconductor chip is constituted by an isotropic ceramic material such as, for example, AlN of a high thermal conductivity, with the other portion of the thermoconductive cooling element being constituted by a composite sintered material comprising AlN and BN which is anisotropic in thermal conductivity.

In accordance with still further advantageous features of the present invention, in order to uniformalize the temperature distribution in a cooling body of the cooling device or system to reduce heat resistance between an external cooler and the cooling body even when the external cooler, using water or air for cooling, is attached to the cooling body which serves as a housing for a semiconductor chip, a portion of the cooling body which comes into contact with the external cooler is constituted by an isotropic ceramic material such as, for example, AlN of high thermal conductivity, with the other portion of the cooling body thereof being constituted by a composite sintered material comprising AlN and BN which is anisotropic in thermal conductivity.

Additionally, in accordance with the present invention, it is advantageous if a portion or a whole of the outer wall surface of the cooling body is formed using, for example, AlN since it is easier to apply a metalization which is extremely important from a connection point of view as compared with the utilization of AlN-BN sintered material.

Moreover, if an outer wall surface of the cooling body is formed of BN, a further advantage is realized in that the BN layer is not adversely affected by water as compared with a material such as AlN. Thus, a composite AlN-BN sintered material or a composite sintered material including a AlN layer or a BN layer as a surface layer constituent can easily be obtained by, for example, a hot pressing operation.

When a composite AlN-BN sintered material exhibiting anisotropy of thermal conductivity is used as a material for the thermoconductive cooling element or the cooling body, if the two-dimensional plane of the highest thermal conductivity of the composite AlN-BN sintered material is disposed substantially flat, inclined, or perpendicular with respect to a heat flow direction in which the heat of the semiconductor element such as a semiconductor chip is transmitted from the thermoconductive cooling element to the cooling body, values can be changed in a range from an upper to a lower limit value with respect to the heat transfer performance of the cooling body. By virtue of this arrangement, a cooling device having a heat transfer performance matching the quantity of heat generated in each LSI chip can be mass-produced at low cost even if the thermoconductive cooling element or the cooling body is formed so as to have the same structure or constructional features.

Additionally, since the Vickers hardness of the composite AlN-BN sintered material is about one-fifth or less as compared with a conventional AlN of isotropic thermal conductivity, the overall machinability thereof is improved to a remarkable extent so that the thermoconductive cooling element or the cooling body can be very easily processed. This is of particular significance in situations wherein the thermoconductive cooling element and the cooling body have a large number of closely spaced substantially parallel fins since it is possible to mass-produce the thermoconductive cooling element or cooling body at a low industrial cost.

Table 1 provides an example of the processability of a composite AlN-BN sintered material used in accordance with the present invention when grooved using a sharp-edged grinding wheel.

TABLE 1

|  | AlN-SN sintered material used in the present invention | Conventional, AlN |
|---|---|---|
| Normal grinding force | 3.0 N | 10 N |
| Tangential grinding force | 0.43 N | 2 N |

In Table 1, the values of the grinding resistance are obtained when a groove 4 mm in depth is made using a diamond grind wheel having a thickness of 0.6 mm and a grain size of #200. As compared with conventional AlN grinding, the grinding force in a normal direction of the composite AlN-BN sintered material in accordance with the present invention as shown in the above table is about one-third and, in the tangential direction is about one-fifth as compared with conventional AlN grinding thereby clearly demonstrating the extremely favorable machinability of a sinterd composite material used in accordance with the present invention.

By virtue of the increased machinability of a composite sintered material of AlN-BN in accordance with the present invention, the service life of the grinding wheel against abrasion is extremely long as compared with the service life of the grinding wheel in prior art constructions which is very advantageous for large volume machining.

If a ceramic material of isotropic thermal conductivity is provided on the AlN-BN material of anisotropic thermal conductivity on a portion of the thermal conductive cooling element or the cooling body, the heat flow can be uniformly spread by the ceramic material of isotropic thermal conductivity so that it is possible to perform an operation whereby the temperature distribution in the semiconductor chip is efficiently uniformalized.

Moreover, by virtue of the features of the present invention, it is possible to mass-produce a semiconductor cooling structure of a relatively low cost while nevertheless enhancing the performance of the cooling structure such as the capability of reducing the thermal resistance in the heat transfer with respect to the external cooler.

Advantageously, according to the method of the present invention the composite sintered material for the cooling arrangement is obtained by mixing powder of BN and AlN respectfully having a particle size of 1 $\mu$m and 2 $\mu$m is a predetermined composition ratio of preferably 20 to 50% by weight of BN, with a sintering aid such as, for example, calcium carbonate or ytrrium oxide being added in the amount of about 0.2 to 5 parts by weight. The powdery mixture of BN, AlN and sintering aide is then subjected to a hot press sintering in a nitrogen gas stream at about 1,800° C. and pressure of about 40 MPa for a period of time of about 2 hours so as to arrive at a material having a low thermal conductivity in a direction parallel to an axis of the hot press shaft.

The above and other objects, features, and advantages of the present invention will become more apparent from the following description when taken in connection with the accompanying drawings which show, for the purpose of illustration only, several embodiments in accordance with the present invention.

DETAILED DESCRIPTION

Figure 7:
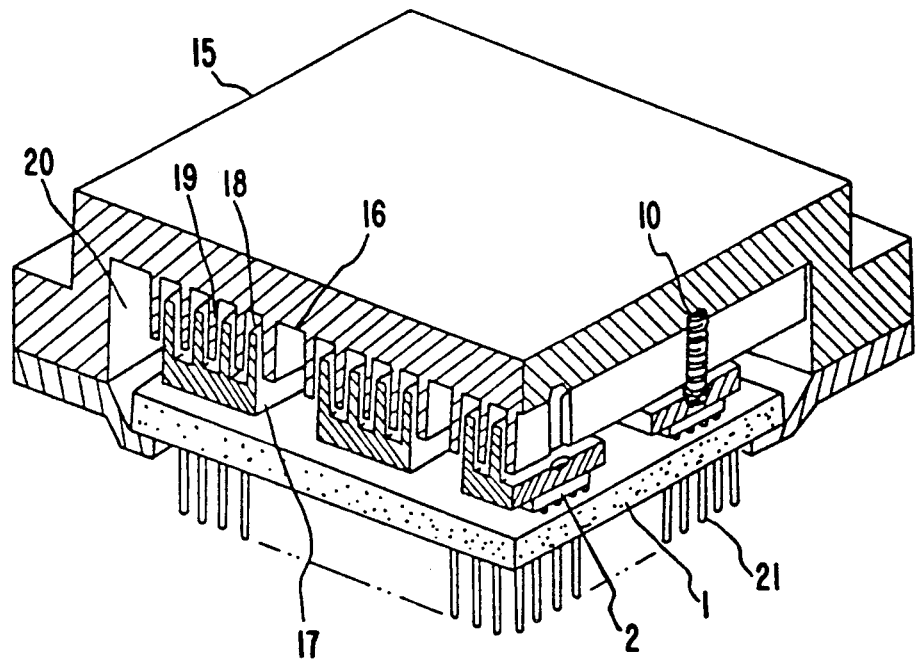
FIG. 7 is a perspective view of a conventional semiconductor coo ing device of the type proposed in Japanese patent laid-open no. 126853/85.

Referring now to the drawings wherein like reference numerals are used throughout the various views to designate like parts and, more particularly, to FIG. 7, according to this figure, a conventional cooling device for semiconductor devices is provided which includes a housing 15 having a plurality of integrally formed plate-like fins 16 disposed in parallel along an inner surface thereof, with the housing 15 being formed of a material having a high thermal conductivity. A plurality of LSI chips 2 are respectively mounted on a multi-layer interconnection substrate 1 disposed on a thermal conductor base 17 having a plurality of integrally formed plate-like fins 18 thereon disposed at the same pitch as a pitch of the plate-like fins 16 whereby the plate-like fins 16, 18 are fitted together or interleaved and spaced from each other by a small gap 19. A closed space 20 is defined by a housing 15 and the multilayer interconnection substrate 1, with the closed space 20 being filled with a gas having a high thermal conductivity such as, for example, helium or hydrogen gas. Heat generated from the LSI chip 2 is transmitted to the thermoconductive base 17 which is in contact with the entire backface of the respective chips 2, and is uniformly diffused therein, with the heat being thereafter transmitted to each fin. Then, the heat is transmitted to the fins 16 through the gas layer of helium or hydrogen formed in the small gap 19 and finally carried away by a cooler (not shown) mounted on the housing 15.

The multilayer interconnection substrate 1 is formed of a ceramic material such as, for example, alumina so as to facilitate an incorporation therein of a multilayered electric wiring at a high density. The housing 15 is also formed of a ceramic material such as, for example, SiC or AlN, taking into account a matching and a coefficient of thermal expansion with the multilayer interconnection substrate 1 as well as a high thermal conductivity and electrical insulating property.

Figure 1:
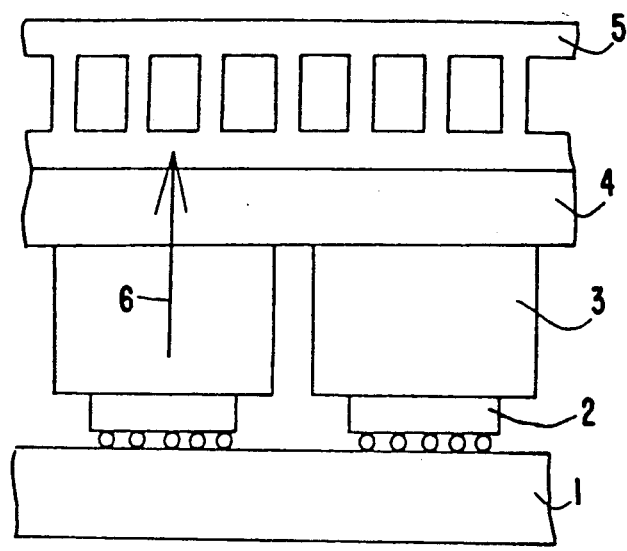
FIG. 1 is a longitudinal cross-sectional view of a cooling system or device for a semiconductor element constructed in accordance with the present invention.

In accordance with the present invention, as shown in FIG. 1, a large number of LSI chips 2 are mounted to the multilayer interconnection wiring substrate 1 formed of a ceramic material, with a thermoconductive cooling element 3 being disposed between each LSI chip 2 and a cooling body 4 cooled by an external cooler 5. The heat generated from each LSI chip 2 flows through the thermoconductive cooling element 3 and the cooling body 4 in a heat flow direction of the LSI chip 2 designated by an arrow 6 and is finally carried away from the external cooler 5.

Figure 2:
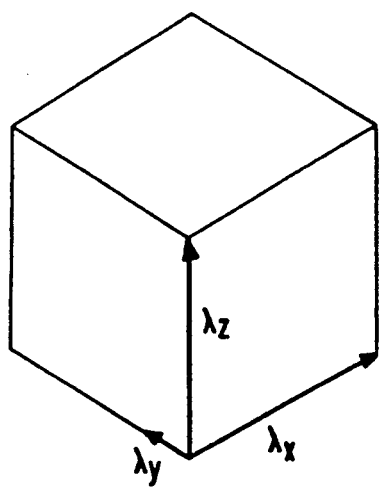
FIG. 2 is a schematic diagram depicting anisotropy of thermal conductivity of a composite AlN-BN sintered material used in the cooling system or device of the present invention.

The thermoconductive cooling element 3 is formed of a composite sintered material consisting essentially of AlN and BN and, considering the composite sintered material to be represented by a unit cube such as shown in FIG. 2, the characteristic of the composite material is such that a thermoconductivity ($\lambda x$, $\lambda z$) in a two-dimensional plane direction represented by an X and a Z axis, is extremely high and the thermal conductivity ($\lambda y$) in a Y-direction perpendicular to the two-dimensional plane is extremely low. The heat transfer performance of the thermoconductive cooling element 3 may be maximized by constructing the cooling element 3 so that the two-dimensional plane of high thermal conductivity ($\lambda x$, $\lambda z$) of the composite AlN-BN sintered material is parallel to the direction of heat flow shown by the arrow 6 in FIG. 1. Conversely, the heat transfer performance is minimized by disposing the two-dimensional plane of high thermal conductivity ($\lambda x$, $\lambda y$) in a direction perpendicular to the heat flow direction shown by the arrow 6. Furthermore, if the thermoconductive cooling element 3 is constructed so that the two-dimensional plane of high thermal conductivity ($\lambda x$, $\lambda y$) is inclined with respect to the heat flow direction shown by the arrow 6, the heat transfer performance of the thermoconductive cooling element 3 can be set at a medium level between the maximum and minimum heat transfer performance.

While the proportional amounts of AlN and BN ca be selected as desired, in order to reduce the anisotropy of the coefficient of thermal expansion, preferably the proportion of BN is about 30%. With this proportion, the thermal conductivity can be equal to about 180 W/mK in the two dimensional plane of high thermal conductivity ($\lambda x$, $\lambda y$) and about 40 W/mK in a plane perpendicular thereto as compared with the use of an AlN material wherein the thermal conductivity obtained is usually 160 W/mK. By virtue of such values, it is possible to provide a construction which causes no difference in thermal resistance and, in accordance with a blending ratio which affords good thermal conductivity, the proportion of BN may be 50% or so, whereby it is possible to reduce the thermal resistance to a great extent as compared with a composite material of AlN.

Consequently, by constituting the thermoconductive cooling element 3 or the cooling body 4 of a composite sintered material of AlN-BN and by disposing the two dimensional plane of high thermal conductivity ($\lambda y$, $\lambda z$) in a plane from parallel to a right angle with respect to the heat flow direction of the LSI chip 2 as shown by the arrow 6 in FIG. 1, the heat transfer performance of the thermoconductive cooling element 3 can be changed in a corresponding relationship to each LSI chip 2 so that the temperatures of the LSI chips 2 can be substantially unified even if a large number of LSI chips 2 mounted on the substrate 1 generate differing quantities of heat.

Moreover, since the Vickers hardness of the composite AlN-BN and sintered material is not greater than one-fifth of the conventional AlN material which is about 1,000 kgf/mm$^2$, it is possible to obtain a remarkable improvement in processability of the material and, consequently, it is possible to subject the thermoconductive cooling element 3 to processing operation such as, for example, cutting, grinding, and polishing, at an extremely low industrial cost.

Furthermore, since the coefficient of thermal expansion of the composite AlN-BN sintered material is about $4 \times 10^{-6}$ per °C, it is possible to match the coefficient of thermal expansion of the ceramic substrate and the LSI chips 2 to reduce heat distortion to an extremely small value thereby enhancing the reliability of the cooling device or system for the semiconductor chip.

Figure 3:
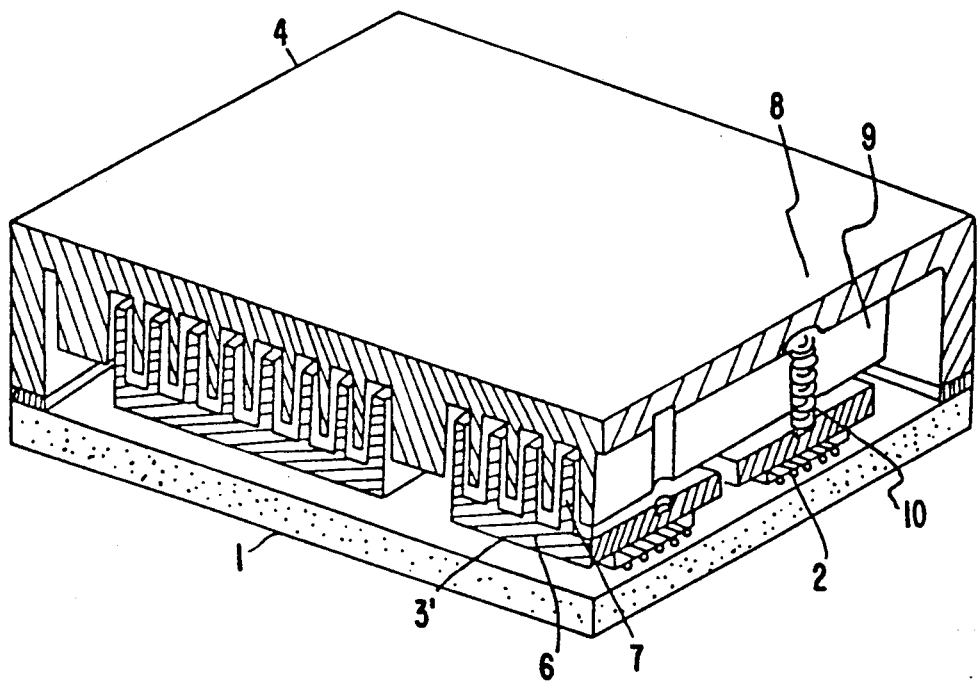
FIG. 3 is a cross-sectional perspective view of another embodiment constructed in accordance with the present invention.

FIG. 3 provides an example of a resilient construction which enhances the heat transfer performance of a thermoconductive cooling element 3' thereby enabling a reduction and a machining tolerance and assembling error of the cooling components as well as a relaxation of thermal stress induced by a generation of heat in the LSI chips 2.

As shown in FIG. 3, a side of the thermoconductive cooling element 3' which comes into contact with each LSI chip 2 is formed as a base 6 including a large number of first thin plate-like fins 7 integrally formed on the base 6 and substantially parallel with one another. A housing 8 covers and seals the LSI chips 2 mounted on the substrate 1 and also serves as a cooling body. Second thin plate-like fins 9, at the same pitch as the first thin plate-like fins 7, are integrally formed on an inner surface of the housing 8, with the first and second thin plate-fins 7, 9 being fitted or interleaved together and spaced from each other by a small gap. The thermoconductive cooling element 3' is in contact with the LSI chips 2 through a spring force supplied by coil springs 10, with the spring force of the coil springs 10 not imposing a larger load than necessary to the LSI chips 2 to maintain the proper positional relationship between the thermoconductive cooling element 3' with respect to each LSI chip 2. The thermoconductive cooling element 3' composed of the thin plate-like fins 7 and the base 6, or the cooling body composed of the housing 8 and the second thin plate-like fins 9, is formed of a composite AlN-BN and sintered material as described hereinabove in connection with FIG. 1 and, in all other respects, is similar to the construction described in connection with FIG. 1.

By virtue of the constructional features of FIG. 3, it is possible for the first and second plate-like fins 7, 9 to be very thin and a large number of thin plate-like fins 7, 9 may be provided in order to enhance the heat transfer performance particularly of the thermoconductive cooling element 3' and the cooling body formed by the housing 8 and second thin plate-like fins 9. However, by using a composite AlN-BN and sintered material, not only can be temperature of each LSI chip 2 be controlled but also a complicated structure can be easily processed. This is of particular significance in forming a large number of fins at a single time since the service life of the grind wheel can be considerably extended by using inexpensive alumina grinding wheels without using a large number of expensive diamond wheels. This is true since the hardness of the composite AlN-BN sintered material is one-fifth or less of a conventional AlN material. Moreover, since the machining accuracy of the thin plate-like fins 7, 9 can be enhanced, it is possible to mass-produce a cooling construction of a high heat transfer performance at a low industrial cost.

Figure 4:
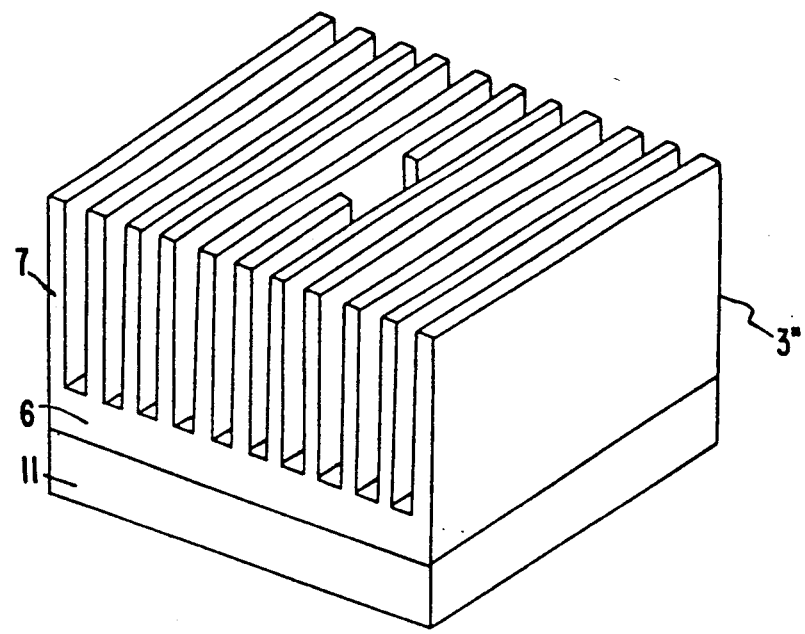
FIGS. 4 and 5 are perspective views of thermoconductive cooling elements of further embodiments of the present invention.

In the embodiment of FIG. 4, a heat diffusion plate 11 formed of an isotropic ceramic material such as, for example, AlN, of high thermal conductivity is bonded to the base 6 of the thermoconductive cooling element 3''; however, in all other respects, the cooling system of device of FIG. 4 is similar in construction to the above-described embodiments.

For the construction such as proposed by FIG. 4, the influence of the anisotropic thermal conductivity of thermoconductive cooling element 3'' is not directly exerted on the LSI chips 2 but is relaxed by the heat diffusion plate 11 so that the temperature distribution in each LSI chip 2 becomes substantially uniform.

Figure 5:
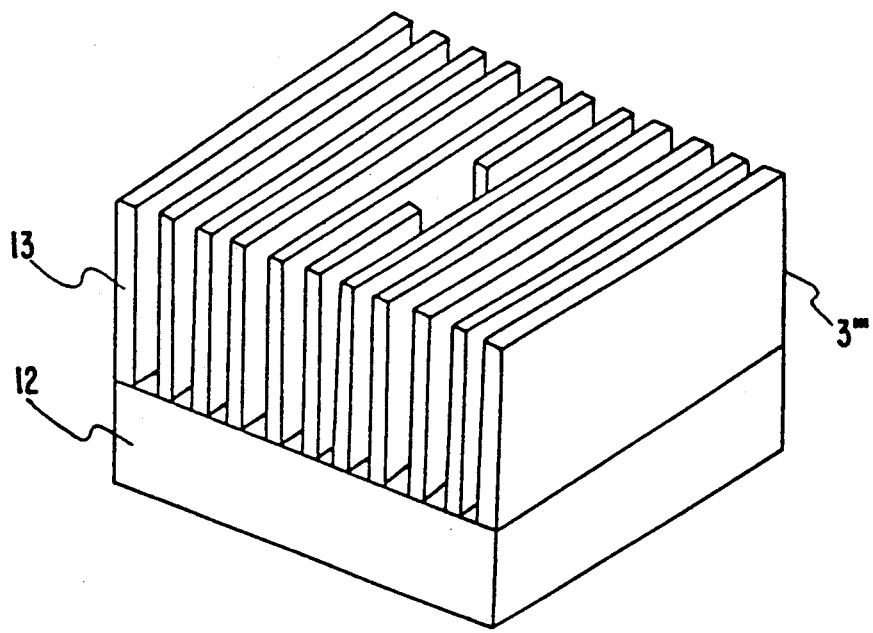

In the embodiment of FIG. 5, a thermoconductive cooling element 3''' includes a heat diffusion base 12 formed by an isotropic ceramic material of high thermal conductivity, and a large number of parallel thin plate-like fins 13, formed of a composite sintered AlN-BN material, are bonded directly onto the heat diffusion base 12. The construction of FIG. 5 is advantageous in that not only the temperature distribution in each LSI chip 2 can be further unified, but also the heat flow in the heat diffusion base 12 is improved so that the heat distribution to each thin plate-like fin 13 can be improved.

Figure 6:
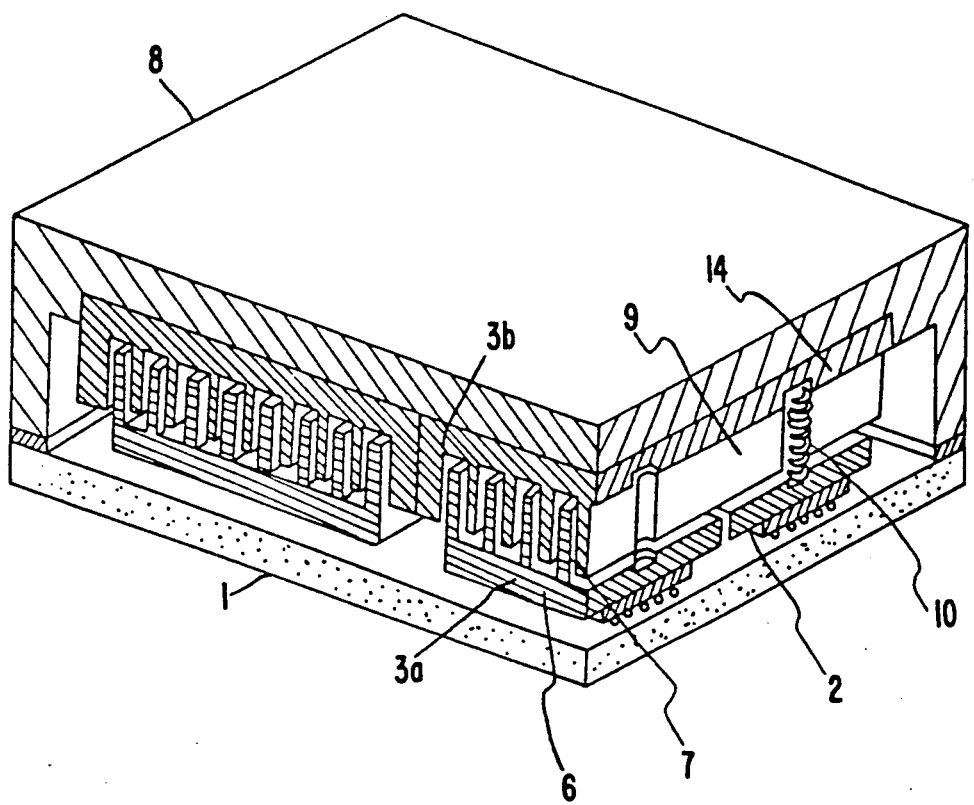
FIG. 6 is a perspective view of yet another embodiment of the present invention.

In the embodiment of FIG. 6, the housing 8 which covers the LSI chips 2 serves as the cooling body, and two thermoconductive cooling elements 3a, 3b are provided which respectively include bases 6 and 14 respectively mounted to the back faces of the LSI chips 2 and inner surface of the housing 8, with the bases 6, 14 respectively being provided with a plurality of their plate-like fins, 7, 9 which are fitted together at a predetermined small spacing from each other. The base 6 is brought into contact with the heat transfer surface of each LSI chip 2 by virtue of a spring 10, while the base 14 is fixed to the inner surface of the housing 8 by, for example, soldering or the like. However, it is also possible for the base 14 to merely be in contact with the inner surface of the housing 8 in a manner similar to the base 6. The thermal conductive cooling elements 3a, 3b with the sets of thin plate-like fins 7, 9 fitted together is formed by using the composite AlN-BN sintered material.

With a construction such as shown in FIG. 6, the small or fine gap between adjacent thin plate-like fins 7, 9 never changes because the two sets of thin plate-like fins 7, 9 and bases 6, 14 have an equal coefficient of thermal expansion which is effective in stabilizing the heat transfer performance of the thermoconductive cooling elements 3a, 3b. This effect is particularly significant in that the two sets of thin plate-like fins 7, 9 can be mass-produced at a low industrial cost under the same processing conditions. Furthermore, since it is not necessary to form the housing 8 using the same material as the thermoconductive cooling elements 3a, 3b, it is possible to freely select a suitable material for the housing 8.

Although the subject matter of the present invention has been described hereinabove in connection with LSI chips 2 and a thermoconductive cooling element, it is understood that the present invention is not limited to the above-described embodiments but is equally applicable to various heat generating semiconductor components including, for example, semiconductor packages and integrated circuit packages.

The composite AlN-BN sintered material used in accordance with the present invention differs in physical property such as thermal conductivity in dependence upon the proportion of BN to that of AlN. A suitable composition for the semiconductor cooling device of the present invention comprises 50-20% by weight of BN and 50-80% by weight of AlN. In a composition wherein the proportion of BN exceeds 50% by weight, a bending strength is not high and the anisotropy of the coefficient of thermal expansion is large, although the composite sinter material of such a composition is relatively high in thermal conductivity. In a composition wherein the proportion of AlN exceeds 80% by weight, the composite sintered material has an inferior cutting property so that both the composite sintered materials are not suitable for heat dissipating components as proposed by the present invention.

The present invention also provides a method for preparing the composite AlN-BN sintered material wherein first a hexagonal BN powder having an average particle diameter not smaller of 1 $\mu$m and an AlN powder having an average particle diameter of about 2 $\mu$m are mixed together in such a manner so as to give a predetermined composition ratio. Then, calcium carbonate or Yttrium oxide is added as a sintering aid in an amount of 0.2 to five parts by weight. The powdery mixture is then subjected to a hot press sintering in a nitrogen gas stream of 1800° C. and a pressure of about 40 MPa for about two hours or so. The sintered material thus obtained is low in a thermal conductivity in a direction parallel to an axis of the hot press shaft. Taking this point into consideration, it is possible to adjust a thermal conductivity by changing the thin plate-like fins 7, 9 as noted above.

In accordance with the present invention, by using a composite AlN-BN sintered material having a Vickers hardness not greater than one-fifth of that of the conventional AlN and having an anisotropic property of thermal conductivity wherein the thermal conductivity in a two-dimensional direction is higher than that of AlN which is isotropic in thermal conductivity, it is possible to mass-produce a cooling device or system for semiconductor elements such as, for example, semiconductor chips, having a heat transfer performance matching the quantity of heat generated for each LSI chip, at a low industrial cost, even if the composite sintered material is uniform in both shape and size.

While we have shown and described several embodiments in accordance with the present invention, it is understood that the same is not limited thereto but is susceptible to numerous changes and modifications as known to one of ordinary skill in the art, and we therefore do not wish to be limited to the details shown and described herein, but intend to cover all such modifications as are encompassed by the scope of the appended claims.

We claim:

1. A cooling arrangement for a semiconductor device including a plurality of semiconductor elements, the cooling arrangement comprising a plurality of cooling means for absorbing heat generated by the semiconductor elements, said plurality of cooling means being disposed so as to be in thermal contact with the semiconductor elements, each of the semiconductor elements having different heat dissipating quantities, wherein at least a part of the cooling means is formed of a composite sintered ceramic material having a high thermal conductivity in a direction of a two-dimensional plane, and a low thermal conductivity in a direction perpendicular to said two-dimensional plane, and each of said cooling means is arranged so that the two-dimensional plane extends in a predetermined direction in accordance with said heat dissipation quantity from each of the semiconductor elements and with a heat flow direction from each of the semiconductor elements producing a uniform temperature in each semiconductor element, and wherein said composite sintered ceramic material comprises a composition of AlN and BN, with the composition including 20–50% by weight of BN.

2. A cooling arrangement according to claim 1, wherein said cooling means comprises a thermoconductive cooling means and a cooling body, said thermoconductive cooling means being in contact with the at least one semiconductor element for transferring heat generated from the at least one semiconductor element to said cooling body, and wherein said cooling body transfers the heat from said thermoconductive cooling means to an external cooler means.

3. A cooling arrangement according to cliam 2, wherein said thermoconductive cooling means includes a base means having a plurality of thin plate-like fins integrally formed thereon and disposed substantially parallel to one another.

4. A cooling arrangement according to claim 3, wherein said cooling body includes a base means having a plurality of thin plate-like fins integrally formed thereon and disposed substantially parallel to one another, and wherein said thermoconductive cooling means and said cooling body are disposed in such a manner that the thin plate-like fins of the thermoconductive cooling means and cooling body are interleaved with a spacing between adjacent fins.

5. A cooling arrangement according to claim 4, wherein said base means of the thermoconductive cooling means is formed of a ceramic material having an isotropic thermal conductivity.

6. A cooling arrangement according to cliam 5, wherein said base means of the cooling body is formed of a ceramic material having an isotropic thermal conductivity.

7. A cooling arrangement according to claim 2, wherein said cooling body includes a housing means, and a fluid of high thermal conductivity is sealed within said housing means.

8. A cooling arrangement to claim 7, wherein at least a part of an outer wall surface of said cooling body is formed of said composite sintered material.

9. A cooling arrangement according to claim 8, wherein an entire outer wall surface of said cooling body is formed of said composite sintered material.

10. A cooling arrangement according to claim 1, wherein said cooling means includes a thermoconductive cooling means having a base means and a plurality of thin plate-like fins integrally formed thereon and disposed substantially parallel to one another, and a housing means for covering and sealing the at least one semiconductor element on a substrate means; said housing means including a plurality of thin plate-like fins integrally formed on an inner surface thereof and disposed substantially parallel to one another, said thin plate-like fins of said thermoconductive cooling means and said housing means being arranged so as to be interleaved with a spacing between adjacent fins.

11. A cooling arrangement according to claim 1, wherein said cooling means includes a thermoconductive cooling means for transferring heat from the at least one semiconductor element including a heat diffusion base means having a pluralityo f thin plate-like fins thereon for insuring a uniform heat distribution of heat generated by the at least one semi-conductor element.

12. A cooling arrangement according to claim 11, wherein the heat diffusion base means is formed of an isotropic ceramic material of high thermal conductivity.

13. A cooling arrangement according to claim 1, wherein the cooling means includes a first thermoconductive cooling means and thermal contact with the at least one semiconductor device including a base means and a plurlaity of thin plate-like fins integrally formed thereon and disposed substantially parallel to each other, a second thermoconductive cooling means including a base means and a plurality of thin plate-like fins integrally formed thereon and disposed substantially parallel to each other, said plurality of thin plate-like fins of said first and second thermoconductive cooling means being interleaved with a spacing between adjacent fins, and cooling body means in contact with the second thermoconductive cooling means for transferring heat therefrom.

14. A cooling arrangement according to claim 13, wherein the cooling body means includes a housing means for covering the at least one semiconductor element.

15. A cooling arrangement for cooling a plurality of semiconductor elements, the cooling arrangement comprising, a plurality of cooling means for absorbing heat generated by the plurality of semiconductor elements, said cooling means being disposed so as to be in thermal contact with the plurality of semiconductor elements, wherein at least a part of the cooling means are formed of a composite sintered ceramic material of AlN and BN with 20–50% by weight of BN, and wherein each of said cooling means is disposed in a predetermined direction with respect to a heat flow direction from each of the semiconductor element in which heat of the plurality of semiconductor elements is transmitted through said cooling means so that said cooling means have a heat transfer performance matching a quantity of heat generated in the respective semiconductor elements.

16. A cooling arrangement according to claim 15, wherein said cooling means comprises at leastone thermoconductive cooling means and a cooling body, said at least one thermoconductive cooling means being in contact with the plurality of semiconductor elements and transferring the heat generated from the plurality of semiconductor elements to said cooling body, and wherein said cooling body transfers the heat from said at least one thermoconductive cooling means to an external cooler means.

17. A cooling arrangement according to claim 16, wherein said at least one thermoconductive cooling means includes a base means having a plurality of thin plate-like fins integrally formed theroen and disposed substantially parallel to one another.

18. A cooling arrangement according to claim 17, wherein said cooling body includes a base means having a plurality of thin plate-like fins integrally formed thereon and disposed substantially parallel to one another.

19. A cooling arrangement according to claim 18, wherein said base means of the at least one thermoconductive cooling means is formed of a ceramic material having an isotropic thermal conductivity.

20. A cooling arrangement according to claim 19, wherein said base means of the cooling body is formed of a ceramic material having an isotropic thermal conductivity.

21. A cooling arrangement according to claim 15, wherein the cooling means includes at least two thermoconductive cooling means and a cooling body, each of said at least two thermoconductive cooling means are in contact with at least one of the plurality of semiconductor elements for transferring the heat generated from the semiconductor elements to said cooling body, and wherein said cooling body transfers the heat from said at least two thermoconductive cooling means to an external cooler means.

22. A cooling arrangement according to claim 15, wherein the cooling means includes at least two thermoconductive cooling means including a plurality of thin plate-like fins mounted on a common heat diffusion base means for insuring a uniform heat distribution of heat generated by said plurality of semiconductor elements.

23. A cooling arrangement according to claim 22, wherein the heat diffusion base means is formed of an isotropic ceramic material of high thermal conductivity.

24. A cooling arrangement according to claim 15, wherein the cooling means includes at least two thermoconductive cooling means each including a first base means having a plurality of thin plate-like fins integrally formed thereon and disposed substantially parallel to one another and a second base means having a plurality of thin plate-like fins formed thereon and disposed substantially parallel to one another, said plurality of plate-like fins of said first and second base means of said at least two thermoconductive cooling means being interleaved with a spacing between adjacent fins, and a cooling body means in contact with the second base means of said at least two thermoconductive cooling means for transferring of heat therefrom.

25. A cooling arrangement according to claim 24, wherein said cooling body includes a housing means for covering the plurality of semiconductor elements.

26. A cooling arrangement according to claim 15, wherein said cooling means includes at least two thermoconductive cooling means in contact with the plurality of semiconductor elements for transferring heat from the plurality of semiconductor elements, a cooling body is in contact with the at least two thermoconductive cooling means for transferring heat therefrom, and an external cooler means for transferring heat from said cooling body.

27. A cooling arrangement according to claim 15, wherein said cooling means includes at least two thermoconductive cooling means each having a base means and a plurality of thin plate-like fins integrally formed thereon and disposed substantially parallel to one another, and a housing means for covering and sealing the plurality of semiconductor elements on a substrate means, said housing means including a plurality of thin plate-like fins integrally formed on an inner surface thereof and disposed substantially parallel to one another, said thin plate-like fins of each of said thermoconductive cooling means and said housing means being arranged so as to be interleaved with a space between adjacent fins.

28. A cooling arrangement, for a semiconductor device including at least one semiconductor element, the cooling arrangement comprising cooling means for absorbing heat generated by the at least one semiconductor element, said cooling means being disposed so as to be in thermal contact with the at lesat one semiconductor element, said cooling means comprises a thermoconductive cooling means and a cooling body, said thermoconductive cooling means being in contact with the at least one semiconductor element for transferring heat generated from the at least one semiconductor element to said cooling body, said cooling body transferring the heat from said thermoconductive cooling means to an external cooler means, said thermoconductive cooling means includes a base means having a plurality of thin plate-like fins integrally formed thereon and disposed substantially parallel to one another a heat diffusion plate means is formed of a ceramic material of isotropic thermal conductivity and is bonded to said base means of the thermoconductive cooling means, and wherein the cooling means is formed of a composite sintered ceramic material having a high thermal conductivity in a direciton of a two-dimensional plane extending in a predetermined direction with respect to a heat flow direction from the at least one semiconductor element and a low thermal conductivity in a direction perpendicular to said two dimensional plane.

29. A cooling arrangement according to claim 28, wherein said cooling body includes a base means having a plurality of thin plate-like fins integrally formed thereon and disposed substantially parallel to one another, and wherein said thermoconductive cooling means and said cooling body are disposed in such a manner that the thin plate-like fins of the thermoconductive cooling means and cooling body are interleaved with a spacing between adjacent fins.

30. A cooling arrangement according to claim 29, wherein a heat diffusion plate formed of a ceramic material of isotropic thermal conductivity is bonded to said base means of the cooling body.

31. A cooling arrangement for a semiconductor device including at least one semiconductor element, the cooling arrangement comprising cooling means for absorbing heat generated by the at least one semiconductor element, said cooling means being disposed so as to be in thermal contact with the at least one semiconductor element, the cooling means is formed of a composite sintered ceramic material comprising AlN and BN and has a high thermal conductivity in a direction of a two-dimensional plane extending in a predetermined direction with respect to a heat flow direction from the at least one semiconductor element and a low thermal conductivity in a direction perpendicular to said two-dimensional plane, said cooling means includes a thermoconductive cooling means for transferring heat from the at least one semiconductor element comprising a base means and a plurality of thin plate-like fins integrally mounted on said base means and disposed substantially parallel to one another, and wherein a heat diffusion plate means is bonded to the base means for uniform temperature distribution of heat generated by the at least one semiconductor element.

32. A cooling arrangement according to claim 31, wherein the heat diffusion plate means is formed of an isotropic ceramic material.

33. A cooling arrangement according to claim 32, wherein the isotropic ceramic material is AlN.

34. A cooling arrangement for cooling a plurality of semiconductor elements, the cooling arrangement comprising cooling means for absorbing heat generated by the plurality of semiconductor elements, said cooling means being disposed so as to be in thermal contact with the plurality of semiconductor elements, the cooling means are formed of a composite sintered ceramic material disposed at a predetermined direction with respect to a heat flow direction in which heat of the plurality of semiconductor elements is transmitted through said cooling means so that said cooling means have a heat transfer performance matching a quantity of heat generated in the respective semiconductor elements, said cooling means comprises at least one thermoconductive cooling means and a cooling body, said at least one thermoconductive cooling means being in contact with the plurality of semiconductor elements and transferring the heat generated from the plurality of semiconductor elements to said cooling body, said cooling body transferring the heat from said at least one thermoconductive cooling means to an external cooler means, said at least one thermoconductive cooling means includes a base means having a plurality of thin plate-like fins integrally formed thereon and disposed substantially parallel to one another, and wherein a heat diffusion plate formed of a ceramic material is isotropic thermal conductivity is bonded to said base means of the at least one thermoconductive cooling means.

35. A cooling arrangement according to claim 34, wherein said cooling body includes a base means having a plurality of thin plate-like fins integrally formed theroen and disposed substantially parallel to one another.

36. A cooling arrangement according to claim 35, wherein heat diffusion plate formed of a ceramic material of isotropic thermal conductivity is bonded to said base means of said cooling body.

37. A cooling arrangement according to claim 36, wherein at least a part of an outer wall surface of said cooling body is formed of one of an AlN or BN sintered material.

38. A cooling arrangement according to claim 37, wherein an entire outer wall surface of said cooling body is formed by one of an AlN or BN sintered material.

39. A cooling arrangement for cooling a plurality of semiconductor elements, the cooling arrangement comprising cooling means for absorbing heat generated by the pluralityo f semiconductor elements, said cooling means being disposed so as to bein thermal contact with the plurality of semiconductor elements, the cooling means are formed of a composite sintered ceramic material comprising AlN and BN and are disposed at a predetermined direction with respect to a flow direction in which heat of the plurality of semiconductor elements is transmitted through said cooling means so that said cooling means have a high heat transfer performance matching a quantity of heat generated in the respective semiconductor elements, and wherein the cooling means includes at least two thermoconductive cooling means each comprising a base means having a plurality of plate-like fins integrally formed theroen and disposed substantially parallel to one another, and a heat diffusion plate means is bonded to both of said base means for uniform distribution of heat generated by the plurality of semiconductor elements.

40. A cooling arrangement according to claim 39, wherein the heat diffusion plate means is formed of an isotropic ceramic material.

41. A cooling arrangement according to claim 40, wherein the isotropic ceramic mateiral is AlN.

42. A cooling arrangement according to one of claims 1 or 5, wherein said predetermined direction is inclined with respect to the heat flow direction.

* * * * *